United States Patent
Romani

(10) Patent No.: US 7,719,339 B2
(45) Date of Patent: May 18, 2010

(54) CIRCUIT ARRANGEMENT AND METHOD FOR LIMITING A SIGNAL VOLTAGE

(75) Inventor: Ernesto Romani, Munich (DE)

(73) Assignee: National Semiconductor Germany AG, Unterhaching (DE)

(*) Notice: Subject to any disclaimer, the term of this patent is extended or adjusted under 35 U.S.C. 154(b) by 47 days.

(21) Appl. No.: 12/102,170

(22) Filed: Apr. 14, 2008

(65) Prior Publication Data

US 2008/0258796 A1    Oct. 23, 2008

(30) Foreign Application Priority Data

Apr. 19, 2007    (DE) ........................ 10 2007 018 613

(51) Int. Cl.
    *H03K 5/08*      (2006.01)
(52) U.S. Cl. .............. 327/321; 327/309; 327/318; 327/328; 330/284; 341/143
(58) Field of Classification Search ............... 327/309, 327/312, 318, 321, 323, 327, 328; 341/143; 330/284

See application file for complete search history.

(56) References Cited

U.S. PATENT DOCUMENTS

| | | | |
|---|---|---|---|
| 4,581,589 A | 4/1986 | Ikoma | |
| 5,327,101 A | 7/1994 | Neely et al. | |
| 6,424,280 B2 * | 7/2002 | Sadkowski | 341/143 |
| 6,882,861 B2 * | 4/2005 | Panasik et al. | 455/553.1 |
| 6,989,778 B2 | 1/2006 | Clara et al. | |
| 2005/0093732 A1 | 5/2005 | Clara et al. | |

FOREIGN PATENT DOCUMENTS

| | | |
|---|---|---|
| DE | 1 113 247 A | 8/1961 |
| DE | 10342057 A1 | 5/2005 |

OTHER PUBLICATIONS

Horowitz, Paul et al., "The Art of Electronics 2nd Edition", Cambridge University Press, 1989, pp. 229-230.*

\* cited by examiner

*Primary Examiner*—Lincoln Donovan
*Assistant Examiner*—Patrick O'Neill
(74) *Attorney, Agent, or Firm*—Pearne & Gordon LLP

(57) ABSTRACT

The invention relates to the field of signal processing. It is an object of the invention to provide for limitation of a signal voltage to a predetermined maximum voltage (Vmax). To this end, an input signal (Vin) is applied to a voltage divider which includes a variable-resistance component (T1) whose resistance is controlled by a control signal. An output signal (Vin') is picked-up at the variable-resistance component (T1). The control signal is generated as an amplified difference between the output signal (Vin') and a fixed reference voltage (Vmax/2), so that for an "overvoltage case" in which the value of the input signal (Vin) exceeds that of a predetermined maximum voltage (Vmax) the output signal (Vin') is kept substantially constant.

7 Claims, 3 Drawing Sheets

CIRCUIT ARRANGEMENT AND METHOD FOR LIMITING A SIGNAL VOLTAGE

BACKGROUND OF THE INVENTION

FIELD OF THE INVENTION

The present invention relates to the field of signal processing, and in particular to a circuit arrangement and a method for limiting the signal voltage upstream of a processing stage of a signal processing device.

Many circuits or parts of circuits of a signal processing device (e.g. sigma-delta analogue-digital converter) allow only a limited input voltage range for the signal to be fed to a particular processing stage.

In order to illustrate this problem, below, a circuit arrangement for limiting a signal voltage is explained first with reference to FIGS. 1 to 3, which circuit arrangement is based on internal operational knowledge by the applicant.

FIG. 1 shows a signal amplifier for amplification (voltage amplification) of an input signal Vin and for outputting the amplified input signal Vin as an output signal Vout of the signal amplifier.

The signal amplifier comprises a circuit arrangement VL for limiting the signal voltage, hereinafter referred to as a "voltage limiter", and an amplifier stage A connected downstream. In the embodiment shown, both the input signal Vin and the output signal Vout of the signal amplifier are referenced to a fixed reference potential GND (electrical mass) in a single-ended design.

It is the function of the voltage limiter VL, from the input signal Vin fed to its input, to form an output signal Vin', and to output the latter to the amplifier stage A. In this process the formation of the output signal Vin' based on the input signal Vin has a voltage limiting function such that in the case of the value of the input signal Vin being lower than a predetermined maximum voltage Vmax, the output signal Vin' is essentially equal to the input signal Vin; and
 in the case of the value of the input signal Vin being higher than the predetermined maximum voltage Vmax, the output signal Vin' is essentially equal to the maximum voltage Vmax.

The voltage limiter VL functions very simply: by means of a comparator COMP the input signal (input voltage) Vin is compared to the predetermined maximum voltage Vmax.

If the result of this comparison states that Vin is lower than Vmax, then a first switch S1 is closed and a second switch S2 is opened. In this arrangement the first switch S1 connects a circuit branch point 10, to which the input signal Vin has been applied, to a circuit branch point 20 provided for outputting the output signal Vin'. The second switch S2 connects a circuit branch point S12, which is provided for inputting the maximal voltage Vmax, to the circuit branch point 20. Thus in the case of Vin<Vmax the following applies: Vin'=Vin.

However, if the comparison carried out with the use of the comparator COMP states that Vin is greater than Vmax, then by means of the comparator output signal the first switch S1 is opened and the second switch S2 is closed. Thus in this case (Vin>Vmax) the following applies: Vin'=Vmax.

FIGS. 2 and 3 show an exemplary development of the input voltage Vin as a function of the time t (FIG. 2) and the development of the output voltage Vin' (FIG. 3), which development results from the voltage limiting function, which output voltage Vin' is limited to the maximum value Vmax.

With reference to FIG. 1 the output signal Vin' of the voltage limiter VL is then used as the input signal of the amplifier stage A, which in the example shown in a manner that is known per se is designed as an inverting amplifier for outputting the output signal Vout.

The amplifier stage A comprises an operational amplifier OPAMP whose non-inverting input connection is connected to the mass GND and whose inverting input connection on the one hand is connected to the circuit branch point 20 by way of a resistor R1, and is thus impinged on by the output signal Vin' of the voltage limiter VL, and on the other hand is connected to an output connection by way of a resistor R2, at which output connection the amplifier output signal Vout is provided.

As far as the voltage amplification of the amplifier stage A is concerned, the following applies in a manner that is known per se: Vout=−(R2/R1)×Vin'.

By means of the switches S1 and S2, which are, for example, designed as switching transistors, the output branch point 20 of the voltage limiter VL can in a simple manner be switched between the signals Vin and Vmax.

In particular in the case of applying this voltage limiting for demanding signal processing devices, the method described is, however, also associated with disadvantages. There is a particularly serious disadvantage in that as a result of switching, in practical application more or less significant interference such as voltage peaks etc. arise in the signal Vin', which interference negatively affects the quality of the output signal Vout.

In particular, it is difficult in practical application during a change in the comparator output signal to trigger, at the switches S1 and S2, switching procedures that occur exactly synchronously, and in this way prevent any voltage jumps in the signal Vin' from occurring.

SUMMARY OF THE INVENTION

It is thus an object of the present invention to provide a circuit arrangement and a method for limiting the signal voltage upstream of a processing stage of a signal processing device, by means of which circuit arrangement and method it becomes possible to reduce signal interference.

According to the invention this object is met by a circuit arrangement for limiting a signal voltage upstream of a processing stage of a signal processing device, comprising:

an input for inputting an input signal,
an output for outputting an output signal to the processing stage, and
a voltage limiting circuit connected to the input and the output, to which voltage limiting circuit the input signal is fed, and which voltage limiting circuit from this forms the output signal such that
in the case of the value of the input signal being less than that of a predetermined maximum voltage the output signal is essentially proportional to the input signal, and
in the case of the value of the input signal exceeding that of the predetermined maximum voltage the output signal is essentially constant,
wherein the voltage limiting circuit comprises:
a voltage divider to which the input signal is applied and which comprises at least one voltage divider component whose resistance can be varied by means of a control signal, and at which voltage divider component the output signal is formed as a voltage drop, and
a differential amplifier for amplifying the difference between the output signal and a reference voltage that corresponds to the maximum voltage, with the output signal of said differential amplifier being fed as the control signal to the variable-resistance voltage divider component.

Further, according to the invention, the above object is met by a corresponding method for limiting a signal voltage. Advantageous improvements of the circuit arrangement are explained below. These improvements of the circuit arrangement can in a corresponding and advantageous manner also be used for the method according to the invention. The improvements can be provided as such or in combination with one another.

The basic idea of the invention consists of using a voltage comparison not directly for switching between the input voltage and the maximum voltage, but instead, of using it in the context of closed-loop control of the output signal, by means of which closed-loop control the value of said output signal is limited to a maximum value. In this way it becomes possible, in particular, to prevent signal interference from being generated during signal processing.

The circuit arrangement for limiting the signal voltage according to the invention comprises:
- a voltage divider to which the input signal is applied and which comprises at least one voltage divider component whose resistance can be varied by means of a control signal, and at which voltage divider component the output signal is formed as a voltage drop; and
- a differential amplifier for amplifying the difference between the output signal and a reference voltage that corresponds to the maximum voltage, with the output signal of said differential amplifier being fed as the control signal to the variable-resistance voltage divider component.

The voltage limiting method implemented in this manner uses as a reference quantity a reference voltage that corresponds to the maximum voltage to which the output signal is compared in the context of closed-loop control. The control signal is the closed-loop control deviation signal of this closed-loop control and controls the variable-resistance voltage divider component at which the output signal is formed, e.g. directly picked up (tapped), as a voltage drop.

As will be shown in the exemplary embodiments of the invention that are described below, the reference voltage can, for example, be identical to the maximum voltage or it can differ by a certain factor from the maximum voltage.

The concrete selection of the reference voltage ultimately depends on the concrete design of the voltage limiter.

In other words, in the invention, in the case of the input signal exceeding the maximum voltage there is no switchover to the output signal (to the maximum voltage). Instead, in the case of such exceeding, a closed-loop control, preferably a linear closed-loop control, becomes active or is activated. In this way a "smooth transition" between the case of "input voltage<maximum voltage" and "input voltage>maximum voltage" can be ensured without there being any interference such as interference pulses or voltage peaks in the output signal.

In principle the invention can be used for limiting the signal voltage upstream of any processing stages of a signal processing device, for example upstream of externally wired operational amplifiers, data transducers etc.

A preferred exemplary embodiment provides for the signal voltage limitation to be upstream of at least one amplifier stage of a sigma-delta analogue-digital converter.

Generally speaking, in a delta-sigma analogue-digital converter the integrated ("sigma") difference ("delta") between an analogue input signal and an analogue presentation of the quantised digital output signal is fed to a quantiser (analogue-digital converter stage). In another embodiment of such a converter, in the narrower sense also designated a "delta modulator", the difference ("delta") between an analogue input signal and the integral ("sigma") of the quantised digital output signal is fed to a quantiser.

By means of feedback the quantiser generates an output bit current whose mean value over time follows that of the analogue input signal.

When compared to a delta-sigma analogue-digital converter that operates in a time-discrete manner, a delta-sigma analogue-digital converter is generally associated with the advantage of lower power consumption, or in the case of a predetermined power consumption with the advantage of greater signal bandwidth. A converter that operates in a time-continuous manner is, for example, known from DE 103 42 057 A1. In this converter the digital output signal of a quantiser is fed to several digital-analogue converters, and the converted (analogue) signals at respective summing branch points are fed back to an analogue filter.

Generally speaking, an analogue filter, which in a sigma-delta analogue-digital converter is arranged upstream of the quantiser, can comprise at least one integrator and/or a resonator. Such an integrator can, for example, comprise a capacitively fed-back operational amplifier or e.g. a so-called transconductance stage (operational transconductance amplifier, OTA) with a capacitive load. Furthermore, a digital signal processor (DSP) for further processing of the digital output signal of the quantiser can be arranged downstream of the quantiser. In this case the digital output signal of the quantiser can be branched from a circuit branch point arranged between the quantiser and the digital signal processor and can be fed to the feedback arrangement.

CMOS technology is a preferred production technology for the circuit arrangement according to the invention for limiting the signal voltage. The circuit arrangement can, in particular, represent a functional block in a larger CMOS circuit arrangement, which comprises, for example, at least one sigma-delta analogue-digital converter of the type explained above.

A preferred exemplary embodiment provides for the voltage divider to comprise a series connection comprising at least one component of a fixed resistance (ohmic resistance) and to comprise the variable voltage component.

In the simplest case the voltage divider comprises a component of a fixed resistance and of the variable-resistance component. However, this in no way precludes the voltage divider from comprising still further components. In this context it should be stated that the concrete electrical characteristics (e.g. "ohmic behaviour") of such further components are of subordinate importance to the voltage limiting function because voltage limiting is based on closed-loop control.

In an embodiment that is particularly simple from the point of view of circuit technology, the variable-resistance component of the voltage divider is formed by a transistor.

Although a bipolar transistor can be used for this purpose, a preferred embodiment according to the invention provides for the transistor to be a FET (field effect transistor), e.g. MOS-FET. In this case, an improvement provides for the output of the differential amplifier to be directly connected to the control input (gate) of the FET.

A preferred embodiment provides for the differential amplifier to comprise a voltage amplification factor of more than $10^3$.

The differential amplifier can, for example, be a conventional operational amplifier. Conventional operational amplifiers usually comprise a voltage divider factor ranging from approximately $10^4$ to approximately $10^5$.

The invention is used for signal voltage limitation both in the case of voltages (input signal and/or output signal) that are referenced to a fixed reference potential and in the case of voltages that are provided in a differential manner. Merely as an example, the above includes embodiments, which are particularly often demanded in practical application, in which embodiments both the input signal and the output signal are either both referenced to a predetermined reference potential (e.g. mass) (single-ended) or in which embodiments both signals are provided in a differential manner (fully differential embodiment).

BRIEF DESCRIPTION OF THE DRAWINGS

Below, the invention is described in more detail with reference to exemplary embodiments as shown in the enclosed drawings. The following are shown.

DESCRIPTION OF THE PREFERRED EMBODIMENT(S)

Figure 1:
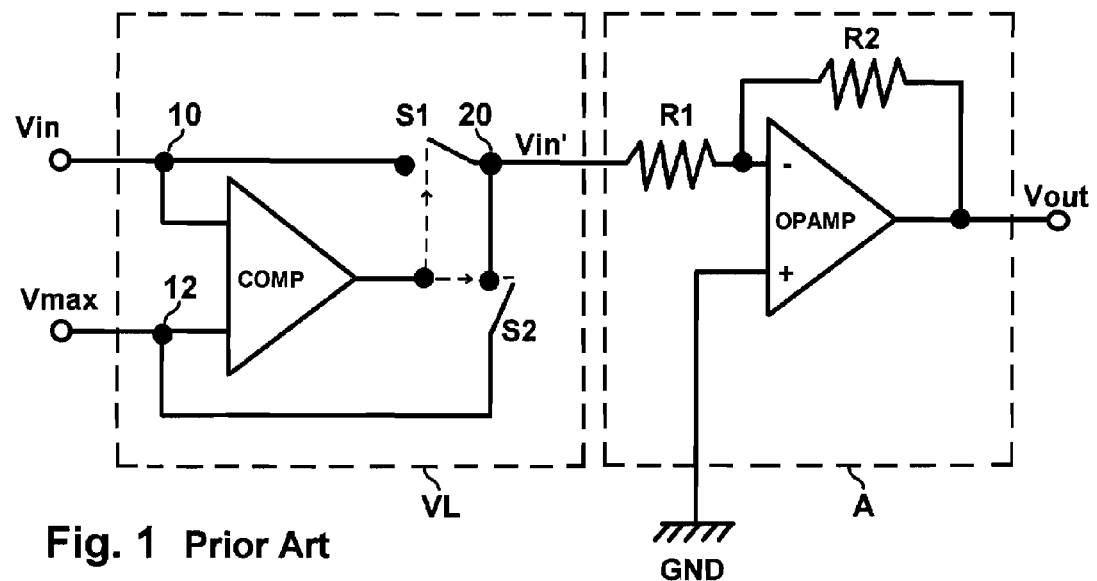
FIG. 1 a circuit diagram of a signal amplifier in which an amplifier stage comprises a voltage limiter arranged upstream.
Figure 2:
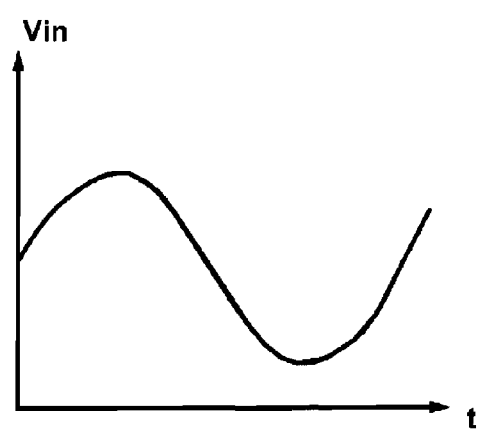
FIG. 2 an exemplary development of an input voltage of the voltage limiter in FIG. 1 as a function of time.
Figure 3:
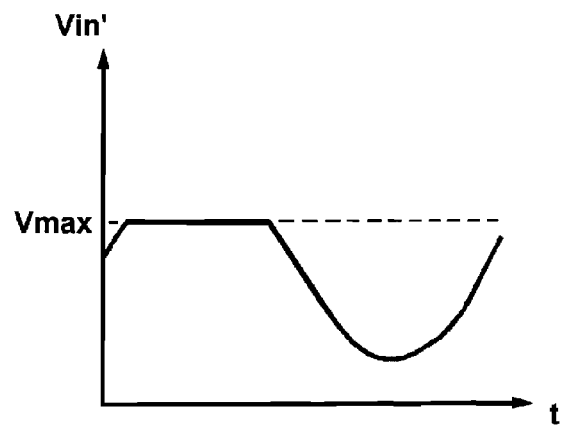
FIG. 3 a resulting development over time of an output voltage of the voltage limiter of FIG. 1.

FIGS. 1 to 3 show a signal amplifier (FIG. 1) for amplification of an input signal Vin and for outputting the amplified input signal Vin as an amplifier output signal Vout, wherein a voltage limiter VL is arranged upstream of the actual amplifier A, which voltage limiter VL has a voltage limiting function in relation to the input voltage. The output voltage Vin' of the voltage limiter VL is limited to the value of a predetermined maximum voltage Vmax (FIGS. 2 and 3).

As already explained in detail above, the voltage limiter VL is associated with a serious disadvantage in that at the points in time of switching (switching of the switches S1 and S2) interference in the output signal Vin' is generated, which interference has a negative effect on the amplifier output signal Vout.

Below, with reference to FIGS. 4 to 6, exemplary embodiments of signal processing devices, in particular of their voltage limiters, are described, in which devices the voltage limiting function is not associated with corresponding signal interference.

In this description of exemplary embodiments essentially the same reference characters are used for components that have the same effect, and essentially only differences from the already described examples are set out.

Figure 4:
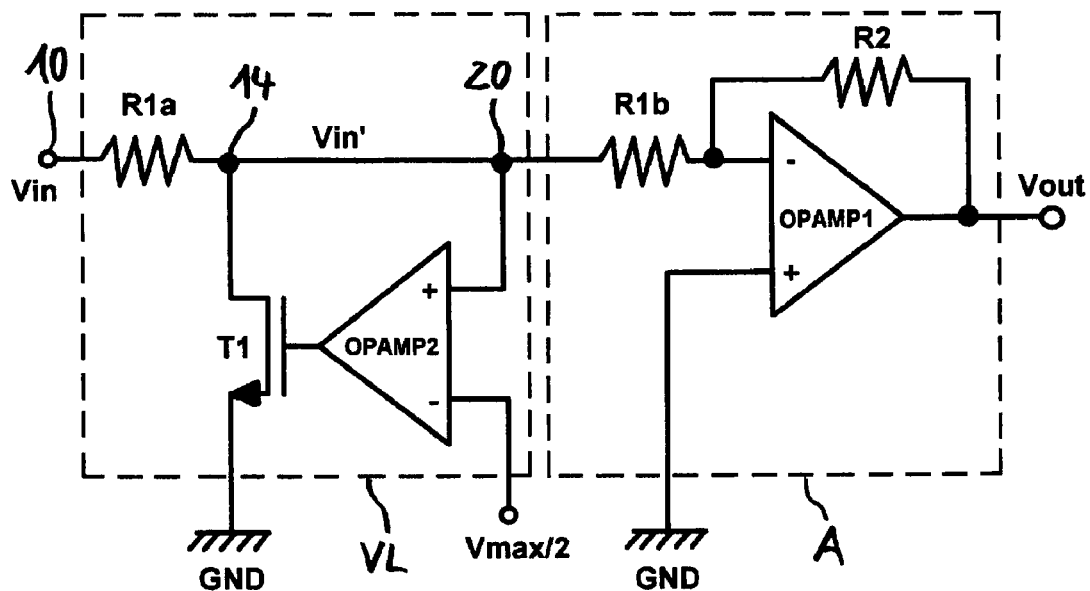
FIG. 4 a circuit diagram of a signal processing device comprising a voltage limiter according to a first exemplary embodiment of the invention.

FIG. 4 shows a signal processing device comprising a voltage limiter VL and a downstream amplifier stage A. For the sake of simplicity the amplifier stage A is designed so as to be exactly the same as the amplifier stage A described above with reference to FIG. 1 so that there is no need to explain the function of this amplifier stage.

In the signal processing device shown in FIG. 4 the design and function of the voltage limiter VL are significant in the context of the invention, with said voltage limiter VL transmitting an output signal Vin' limited to a predetermined maximum value as an input signal to the amplifier stage A, as does the conventional voltage limiter (FIG. 1), however, the voltage limiter VL does not cause any switching-related interference in the signal Vin'.

The voltage limiter VL comprises a circuit branch point 10 on the input side for inputting the input signal Vin, and a circuit branch point 20 on the output side for outputting the output signal Vin' to the amplifier stage A.

Furthermore, the voltage limiter VL comprises a voltage divider formed by a series connection of a resistor R1$a$ and a transistor T1 (in the present embodiment e.g. FET), to which voltage divider the input signal Vin is applied. To this purpose the input branch point 10 is connected, by way of the resistor R1$a$, to a voltage divider pickup 14, which in turn is connected to the fixed reference potential (mass) GND by way of the channel of the transistor T1.

The pickup 14 is further connected to the circuit branch point 20, on the output side, of the voltage limiter VL so that the output signal Vin' is formed as a voltage drop at the channel of the transistor T1. The transistor T1 represents a component of the voltage divider, whose electrical resistance can be varied by means of a control signal applied to the gate of the transistor.

In the example shown, the gate of the transistor T1 is directly connected to the output of an operational amplifier OPAMP2 (differential amplifier). A non-inverting input connection of the operational amplifier OPAMP2 is connected to the output 20, whereas a fixed, predetermined voltage Vmax/2 (half the maximum voltage Vmax) is applied to an inverting input connection.

The operational amplifier OPAMP2 thus amplifies the difference between the output signal Vin' and the voltage Vmax/2, which serves as the reference voltage, with said operational amplifier OPAMP2 with its output signal thus controlling the conductivity of the transistor T1.

As will be explained below, a suitable value of the reference voltage (in the present case: half the maximum voltage Vmax) generally depends on the selected values of the resistors R1$a$ and R1$b$. In the exemplary embodiment shown, the latter resistors comprise, for example, identical resistance values (which from the point of view of circuit technology is particularly simple to implement).

If the value of the input signal Vin is below the maximum voltage Vmax, then (due to the design of the amplifier stage A) an output value Vin' results that is less than the reference voltage Vmax/2. In this case the operational amplifier OPAMP2 outputs a (negative) signal at its output, which as the control signal acts directly on the transistor T1 and brings said transistor T1 to its non-conductive state or holds it in this state. Correspondingly, the very high-impedance path extending from the circuit branch point 14 by way of the transistor T1 to the mass GND has no influence on the formation of the signal Vin' and on the formation of the amplifier output signal Vout from the input signal Vin. In this operational situation Vin' is proportional to Vin, or more precisely expressed: Vin'=Vin/2.

The following applies to the amplifier output voltage Vout:

$$Vout = -(R2/(2 \times R1b)) \times Vin.$$

However, if the value of the input signal Vin exceeds the predetermined maximum voltage Vmax, and accordingly the output voltage Vin' exceeds the reference voltage Vmax/2, then the operational amplifier OPAMP2 brings the transistor T1 to a conductive state. As a result of the improved conductivity of the transistor T1 as a component of the voltage divider R1a, T1, Vin' has, however, a tendency to become smaller again. However, this reduction of Vin' only applies until Vin' has reached the reference voltage Vmax/2, because the signal Vin' then, by way of the operational amplifier OPAMP2 that acts as an automatic gain control amplifier, has a resistance-increasing effect on the transistor T1. In other words, if the reference voltage Vmax/2 is exceeded by the output voltage Vin', the output voltage Vin' is always "regulated down" to the reference voltage Vmax/2.

In summary, the voltage limiter VL has practically no influence on the signal that is transmitted to the amplifier stage A as long as Vin is below the predetermined maximum voltage Vmax. However, as soon as Vin reaches or even exceeds this maximum voltage Vmax, the voltage limiter VL becomes active for closed-loop control of the voltage Vin' to a constant reference value (Vmax/2). At the points in time at which the voltage limiter VL becomes active and (at a level below the voltage limit) becomes inactive again, no interference voltages arise in the signal Vin', which interference voltages could have a detrimental effect on the quality of the amplifier output signal Vout.

The manner in which the operational amplifier OPAMP2 is incorporated in the circuit arrangement ensures a most efficient and rapid closed-loop functionality of the voltage limiter VL. Due to the relatively large voltage amplification of the operational amplifier (typically $>10^3$) it might well be expected that already in the case of relatively small voltage differences (between Vin' and Vmax/2) on the input side the output signal of the operational amplifier assumes either its maximum positive or maximum negative value, so that the operational amplifier in the end operates as a comparator. However, due to the feedback by way of the transistor T1 this is not the case. As it were, this feedback forces the operational amplifier to output an "indecisive" output signal. In this adjusted state the resistance of the source-drain path of the transistor T1 corresponds to the resistance of the resistor R1a.

In the exemplary embodiment according to FIG. 4, the signals Vin, Vin' and Vout are in each case referenced to a shared reference potential (mass GMD). However, this is in no way mandatory.

Figure 5:
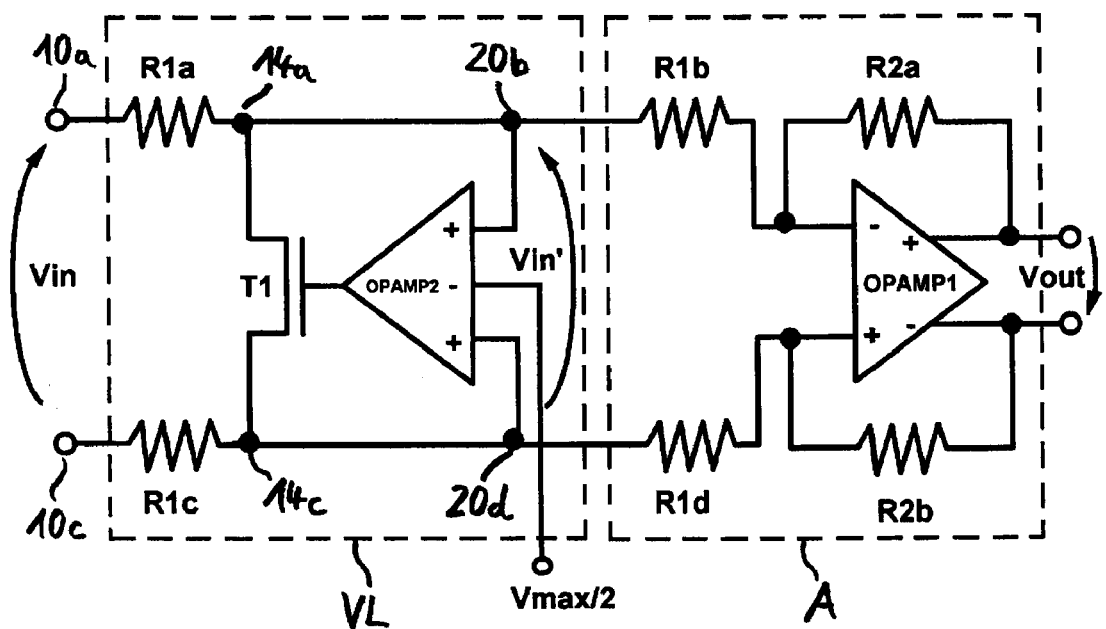
FIG. 5 a circuit diagram of a signal processing device comprising a voltage limiter according to a second exemplary embodiment of the invention.

FIG. 5 shows a signal amplifier comprising a voltage limiter VL and an amplifier stage A, wherein the design and function essentially correspond to the embodiment according to FIG. 4, wherein the signal amplifier is, however, of a fully-differential design. In this arrangement the signals Vin, Vin' and Vout are in each case defined as potential differences as shown in FIG. 5.

Accordingly, the input of the voltage limiter VL comprises two input connections 10a and 10c, while the output of the voltage limiter VL comprises two output branch points 20b and 20d.

The voltage divider to which the input signal Vin is applied comprises a resistor R1a, a transistor T1 and a resistor R1c. In each case first connections of the two resistors R1a, R1c are connected to one of the input branch points 10a, 10c, whereas in each case second connections of the resistors R1a, R1c are connected to one of two circuit branch points 14a and 14c, which in turn are each connected to one of the output connections 20b and 20d. Furthermore, the circuit branch points 14a and 14c are interconnected by way of the channel of the transistor T1.

An operational amplifier OPAMP2, which serves as a differential amplifier, comprises two non-inverting input connections, each being connected to one of the output branch points 20b and 20d. A reference voltage Vmax/2 is applied to an inverting input connection of the operational amplifier OPAMP2. The output of the operational amplifier OPAMP2 is again connected directly to the gate of the transistor T1.

Apart from the fully differential design, the design of the amplifier stage A corresponds to the design of the amplifier stage described with reference to FIG. 4. The operational amplifier OPAMP1 used comprises a differential input and a differential output. The amplifier output voltage Vout is provided as a voltage difference between a non-inverting and an inverting output connection. The non-inverting output connection is connected to an inverting input connection by way of a resistor R2a. The inverting output connection is connected to a non-inverting input connection by way of a resistor R2b. The inverting input connection is connected to the circuit branch point 20b by way of a resistor R1b. The non-inverting input connection is connected to the circuit branch point 20d by way of a resistor R1d.

In the exemplary embodiment shown the resistance values of the resistors R1a, R1b, R1c and R1d are identical. Furthermore, the resistance values of the resistors R2a and R2b are identical.

The amplifier stages described in the exemplary embodiment according to FIGS. 4 and 5 are merely examples; in practical application they can also be constructed differently or can be replaced by other signal processing stages.

Figure 6:
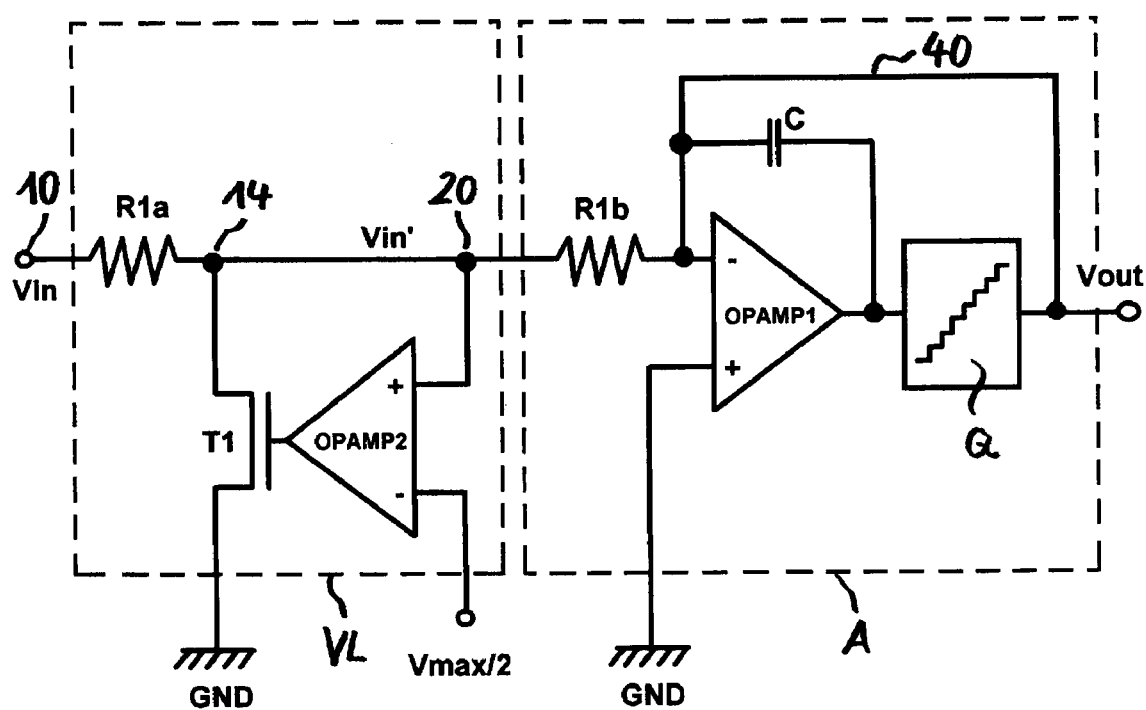
FIG. 6 a circuit diagram of a signal processing device comprising a voltage limiter according to a third exemplary embodiment of the invention.

FIG. 6 shows an exemplary embodiment of a sigma-delta analogue-digital converter comprising a voltage limiter VL with a sigma-delta converter stage A arranged downstream.

In this example the voltage limiter VL is designed so as to be identical to the voltage limiter already described with reference to FIG. 4.

The sigma-delta converter stage A comprises a quantiser Q, operated so as to be pulsed by a timing signal, which quantiser Q quantises an output signal Vin' of the voltage limiter VL so as to generate a digital output signal Vout. Furthermore, the converter stage A comprises an operational amplifier OPAMP1, externally wired to a capacitor C and a resistor R1b in the manner shown, which operational amplifier OPAMP1 subjects the analogue signal Vin' to integration before quantising takes place in order to generate the digital output signal Vout. Finally, the converter stage A comprises a feedback path 40 that feeds back a feedback signal based on the digital output signal Vout.

The voltage limiter VL, which is arranged upstream of the actual sigma-delta converter stage A, advantageously causes voltage limiting of the analogue input signal Vin or Vin'. In this way it is possible to prevent instabilities in the sigma-delta conversion that might otherwise occur.

The invention claimed is:

1. A voltage limiting circuit (VL) for limiting a signal voltage upstream of a processing stage (A) of a signal processing device, where, in the case of the value of an input signal (Vin) of the voltage limiting circuit (VL) being less than that of a predetermined maximum voltage (Vmax), an output signal (Vin') of the voltage limiting circuit (VL) is substantially proportional to the input signal (Vin), and where in an overvoltage case in which the value of the input signal (Vin) exceeds that of the predetermined maximum voltage (Vmax), the output signal (Vin') is substantially constant, the voltage limiting circuit (VL) comprising:

(a) a voltage divider (R1a, T1; R1a, T1, R1c) to which the input signal (Vin) is applied and which includes at least one variable-resistance voltage divider component (T1) whose resistance can be varied by means of a control signal, (b) the voltage divider (R1a, T1; R1a, T1, R1c) being configured such that the output signal (Vin') of the voltage limiting circuit is formed by the variable-resistance voltage divider component (T1), and (c) a differential amplifier (OPAMP2) coupled to the variable-resistance voltage divider component (T1) for amplifying the difference between the output signal (Vin') and a reference voltage (Vmax/2) that corresponds to the maximum voltage (Vmax), with the output signal of said differential amplifier (OPAMP2) to provide the control signal to the variable-resistance voltage divider component (T1), wherein for the overvoltage case the output signal (Vin') of the voltage limiting circuit is substantially constant.

2. The circuit according to claim 1, wherein the voltage divider comprises a series connection of at least one fixed-resistance component (R1a; R1a, R1c) and the variable-resistance voltage divider component (T1).

3. The circuit according to claim 1, wherein the variable-resistance voltage divider component (T1) of the voltage divider is formed by a transistor whose control input is directly connected to the output of the differential amplifier (OPAMP2).

4. The circuit according to claim 3, wherein the transistor is a FET.

5. The circuit according to claim 1, wherein the differential amplifier (OPAMP2) comprises a voltage amplification factor of more than $10^3$.

6. The circuit according to claim 1, wherein the differential amplifier (OPAMP2) is an operational amplifier.

7. A method for limiting a signal voltage upstream of a processing stage of a signal processing device, where in the case of the value of an input signal (Vin) being less than that of a predetermined maximum voltage (Vmax) an output signal (Vin') is substantially proportional to the input signal (Vin), and where in an overvoltage case in which the value of the input signal (Vin) exceeds that of the predetermined maximum voltage (Vmax), the output signal (Vin') is substantially constant, the method comprising:

(a) applying the input signal (Vin) to a voltage divider (R1a, T1; R1a, T1, R1c) which includes at least one variable-resistance voltage divider component (T1) whose resistance can be varied by means of a control signal, (b) forming the output signal (Vin') by the variable-resistance voltage divider component (T1), (c) amplifying the difference between the output signal (Vin') and a reference voltage (Vmax/2) that corresponds to the maximum voltage (Vmax), and (d) providing the amplified difference between the output signal (Vin') and the reference voltage (Vmax/2) as the control signal, wherein for the overvoltage case the output signal (Vin') is substantially constant.

* * * * *